United States Patent
Shibata et al.

(10) Patent No.: US 7,355,278 B2
(45) Date of Patent: Apr. 8, 2008

(54) MOLD DIE FOR A SEMICONDUCTOR DEVICE

(75) Inventors: Akiji Shibata, Hitachi (JP); Akihiro Okamoto, Hitachi (JP); Yosuke Shimazaki, Hitachinaka (JP); Kazumoto Komiya, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 105 days.

(21) Appl. No.: 10/797,003

(22) Filed: Mar. 11, 2004

(65) Prior Publication Data

US 2004/0180475 A1 Sep. 16, 2004

(30) Foreign Application Priority Data

Mar. 11, 2003 (JP) .............................. 2003-064566

(51) Int. Cl.
*H01L 23/04* (2006.01)
*B29C 45/14* (2006.01)

(52) U.S. Cl. ....................... 257/730; 257/783; 257/787; 264/272.11; 264/272.17

(58) Field of Classification Search ...................... None
See application file for complete search history.

(56) References Cited

U.S. PATENT DOCUMENTS 5,766,649 A    6/1998   Azuma 6,157,086 A * 12/2000  Weber .......................... 257/788
6,940,161 B2 *  9/2005  Kawanobe et al. ......... 257/702
2002/0185661 A1  12/2002  Kawanobe et al.

FOREIGN PATENT DOCUMENTS

| JP | 09-036155 | | 2/1997 |
|---|---|---|---|
| JP | 11-121656 | A | 4/1999 |
| JP | 2000-058711 | | 2/2000 |
| JP | 2002057265 | A | 2/2002 |
| JP | 2002-353361 | | 12/2002 |

* cited by examiner

*Primary Examiner*—Alonzo Chambliss
(74) *Attorney, Agent, or Firm*—Antonelli, Terry, Stout & Kraus, LLP.

(57) ABSTRACT

A technology is provided that can seal the opening in a wiring board using a transfer mold insulating resin from the opening. A mold die is used which includes a first die having a recess in a predetermined form and a second flat die. The first die is disposed on a surface of a wiring board which has a plurality of openings and on which a semiconductor chip is mounted via an elastic material. The second die is disposed on a back surface of the wiring board opposite the surface on which the semiconductor chip is mounted. The mold is used for sealing with an insulating resin the periphery of the semiconductor chip and at least one of the openings of the wiring board, wherein the above-described second die has a protrusion around an area overlapping the opening to be sealed with the insulating resin.

12 Claims, 6 Drawing Sheets

US 7,355,278 B2

MOLD DIE FOR A SEMICONDUCTOR DEVICE

BACKGROUND OF THE INVENTION

The present invention relates to a mold die and to a method of manufacture of a semiconductor device using the mold die; and, more particularly, the invention relates to a technology in which a die is used effectively for sealing a semiconductor chip, which is mounted on a wiring board via an elastic material and an opening of the wiring board, by transfer mold processing.

One example of conventional semiconductor devices having a form referred to as a BGA (Ball Grid Array) includes a semiconductor chip, an interposer (wiring board) having an insulating substrate on which a conductive pattern is provided, and an elastic material (elastomer) disposed therebetween for providing stress relaxation. The semiconductor device hereafter referred to includes the above-described elastic material, unless otherwise specified.

The above-described semiconductor device includes, for example as shown in FIG. 9, an opening 4 in the interposer, which includes an insulating substrate 101 on which the conductive pattern 102 is provided, and in the elastic material 2. The conductive pattern 102 and an external electrode 301 of the semiconductor chip 3 are electrically connected by way of the opening 4.

In addition to the opening 4, the described insulating substrate 101 also includes an opening (not shown) for forming an external connecting terminal 6. The opening 4 over which the conductive pattern 102 and the external electrode 301 of the semiconductor chip 3 are connected is hereafter referred to as a bonding opening. The opening for forming the external connecting terminal 6 is hereafter referred to as an external terminal opening.

In the above-described semiconductor device, an insulating resin 5 seals the periphery of the semiconductor chip 3, for example as shown in FIG. 9. The insulating resin 5 also seals the bonding opening 4. The periphery of the semiconductor chip 3 and the bonding opening 4 may be sealed, for example, by transfer mold processing.

The above-described transfer mold processing is carried out, for example, as shown in FIG. 10, by sandwiching the interposer (insulating substrate 101) bearing the semiconductor chip 3 between a first die (hereafter referred to as a top die) 7 having a recess 7A of predetermined form and a second flat die (hereafter referred to as a bottom die) 8, by causing the insulating resin 5 to flow into the resulting space formed therebetween, and by curing the resin 5 (see for example Japanese application patent laid-open publication No. 2002-353361).

Semiconductor devices in a similar form to the above-described semiconductor device include a semiconductor device in which the conductive pattern 102 and the external electrode 301 of the semiconductor chip 3 are electrically connected via a bonding wire. The semiconductor device using a bonding wire may be transfer molded using a groove (recess) provided on a portion overlapping the bonding opening 4 of the interposer to ensure the sealing of the loop of the bonding wire (see for example Japanese application patent laid-open publication No. 2000-058711 (FIG. 6)).

SUMMARY OF THE INVENTION

In the above-described conventional technologies, however, the bottom die 8 has a flat surface 8A which is brought into contact with the insulating substrate 101. Thus, any bending or distortion of the insulating substrate 101 may cause a space to appear between the bottom die 8 and the insulating substrate 101, which is sandwiched between the top die 7 and bottom die 8, as shown in FIG. 11.

In particular, each opening of the insulating substrate 101, which is generally formed by stamping with a die, may thus often have bending or distortion around the opening. The bonding opening 4 also may be subjected to a load caused by the electrical connection of the conductive pattern 102 and the external electrode 301 of the semiconductor chip 3. Thus, bending or distortion often occurs around the bonding opening 4.

With any bending or distortion generated around the bonding opening 4, the transfer mold may allow the insulating resin 5 which flows into the bonding opening 4 to leak into the space formed between the bottom die 8 and the insulating substrate 101, as shown in FIG. 11. The thin insulating substrate 101 cannot bear the injection pressure from the flow of the insulating resin 5 and may float. As a result, the insulating resin 5 may spread over the surface of the insulating substrate 101, as shown in FIG. 12.

The insulating substrate 101 includes, for example, as shown in FIG. 12, external terminal openings 101A outside the bonding opening 4. Thus, if the insulating resin 5 which flows into the bonding opening 4 during the above-described transfer mold operation leaks out, the front end 5A of the leaked insulating resin 5 may spread over the area of the above-described external terminal openings 101A and flow into the above-described external terminal openings 101A. The insulating resin 5 which flows into the external terminal openings 101A may cause poor electrical conduction between the external connecting terminal 6 formed and the conductive pattern 102.

In particular, recent semiconductor devices, which tend to be smaller and to be provided with a higher density, are characterized by a smaller distance between the bonding opening 4 and the external terminal openings 101A. The external terminal openings 101A also tend to have a smaller area. Thus, the leaked insulating resin may more readily cause poor electrical conduction.

As described above, there has been a problem with the conventional method using transfer mold processing for manufacturing the semiconductor device in that the above-described semiconductor devices may have a reduced manufacturing yield.

Accordingly, an object of the present invention is to provide a technique with which it is possible seal the opening of the interposer during transfer mold processing to prevent leakage of the insulating resin from the opening, thereby improving the manufacturing yield of the semiconductor devices.

These and other objects and novel features of the present invention will become apparent upon review of the following description in this specification and the accompanying drawings.

The present invention as disclosed in this application will be summarized as follows.

(1) A mold die includes a first die having a recess in a predetermined form and a second flat die, the first die being disposed on a surface of a wiring board which has a plurality of openings, which surface bears a semiconductor chip via an elastic material, and the second die is disposed on a back surface of the wiring board opposite to the surface which bears the semiconductor chip. The molding die is used for sealing, with an insulating resin, a periphery of the semiconductor chip and at least one of the openings in the wiring board, wherein the second die comprises a protrusion disposed around an area overlapping the opening which is sealed with the insulating resin.

According to the above-described Example (1), when the first die and the second die sandwich the wiring board, the protrusion on the second die can press up against and apply pressure to the wiring board (insulating substrate). With the protrusion pressing up against the wiring board, the elastic material can deform and exert a force which attempts to return it to its original shape. The wiring board (insulating substrate) may then receive from the elastic material a force opposite to the force applied from the protrusion of the second die.

A higher degree of contact can thus be provided between the second die and the wiring board (insulating substrate), thereby preventing the insulating resin which flows into the opening from leaking in between the wiring board (insulating substrate) and the second die.

(2) A method of manufacture of a semiconductor device by sealing, by transfer mold processing using a die, a semiconductor chip mounted on a wiring board via an elastic material, which board includes an insulating substrate having a plurality of openings thereon and on which a conductive pattern is formed, and by sealing at least one of the above-described openings, wherein a die having a protrusion disposed around an area overlapping the sealed opening to be sealed is used for the back die member which bears against the surface of the wiring board opposite to the surface on which the semiconductor chip is mounted.

The above-described Example (2) is a method of manufacture of a semiconductor device using the above-described Example (1). Use of the mold die of the above-described Example (1) can prevent the insulating resin which flows into the opening from leaking out and from flowing into an opening that should not be sealed by the insulating resin. It is thus possible to improve the manufacturing yield of the semiconductor device.

In the following, the present invention, as well as its embodiments (examples), will be described in more detail with reference to the accompanying drawings.

Like reference characters indicate functionally identical elements throughout all the illustrative drawings, and a repeated description thereof is omitted.

DESCRIPTION OF THE INVENTION

Before describing the examples of the present invention, the schematic configuration of a semiconductor device according to the present invention will be described.

Figure 1:
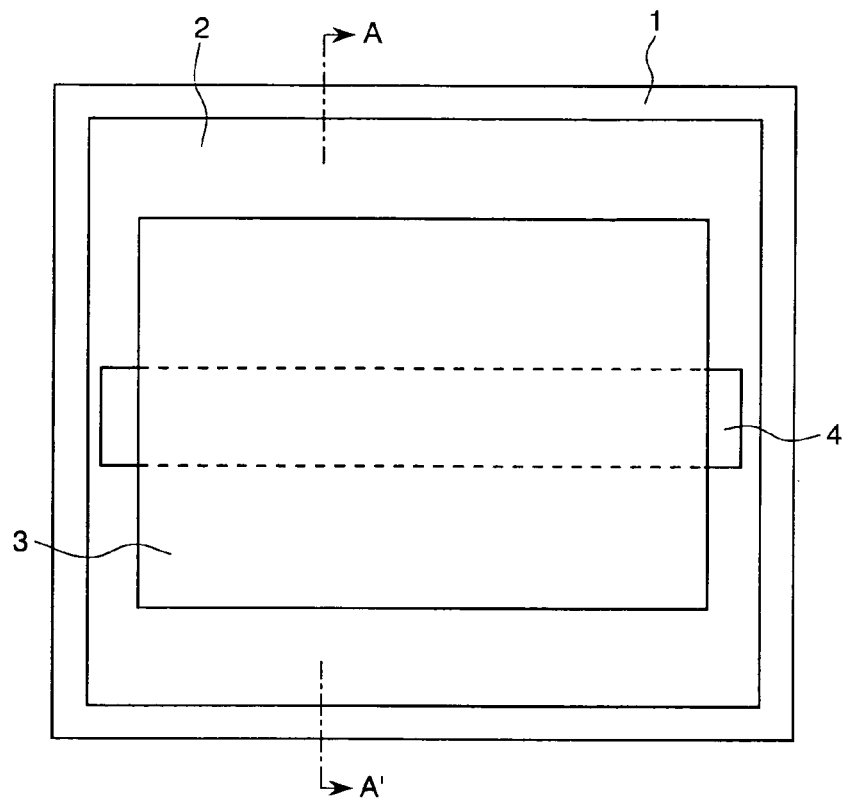
FIG. 1 shows a diagrammatic plan view of the configuration of a semiconductor device according to the present invention.
Figure 2:
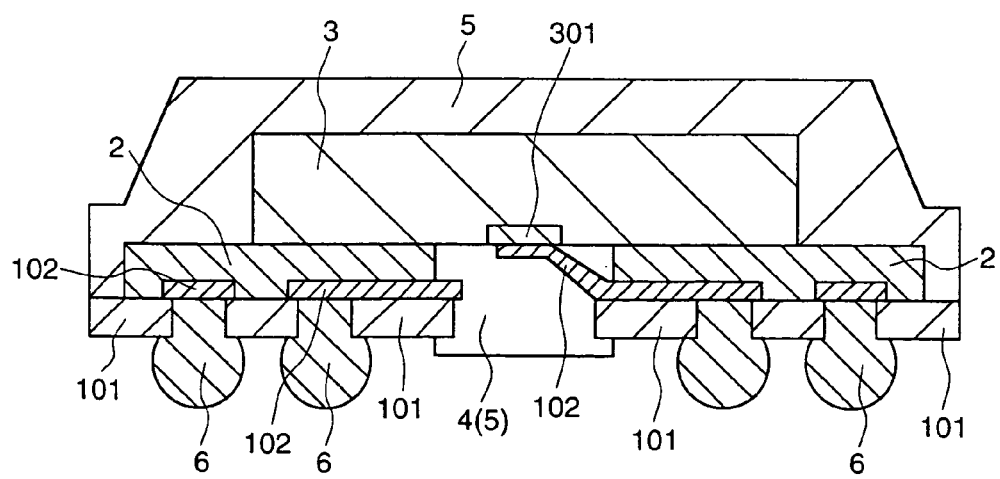
FIG. 2 is a cross-sectional view taken along line A-A' in FIG. 1.

FIGS. 1 and 2 are diagrams which show the configuration of the semiconductor device according to the present invention. FIG. 1 is a plan view of the semiconductor device. FIG. 2 is a cross-sectional view taken along line A-A' in FIG. 1.

The semiconductor device according to the present invention includes an interposer (wiring board) having an insulating substrate 101 on which a conductive pattern 102 is provided, and a semiconductor chip 3, which is bonded on the above-described interposer via an elastic material (elastomer) 2, as shown in FIGS. 1 and 2.

The conductive pattern 102 of the above-described interposer and the external electrode 301 of the semiconductor chip 3 are electrically connected over an opening 4 provided in the interposer (insulating substrate 101) and the elastic material 2, as shown in FIG. 2. The opening 4 hereafter will be referred to as a bonding opening.

In the above-described semiconductor device, an insulating resin 5 seals the periphery of the described semiconductor chip 3, as shown in FIG. 2. The insulating resin 5 also seals the bonding opening 4. The conductive pattern 102 of the interposer is provided, for example, as shown in FIG. 2, on the surface where the semiconductor chip 3 is bonded. The conductive pattern 102 includes, for example, terminals for connection to a print wiring board, such as those referred to as a motherboard and a daughter board.

The insulating substrate 101 of the interposer includes openings in the regions of the terminals thereof. The openings include external connecting terminals 6 formed of a ball-like shaped bonding agent. The opening for providing the external connecting terminal 6 hereafter will be referred to as an external terminal opening.

The elastic material 2 is, for example, PTFE (polytetrafluoroethylene). The elastic material 2 has a thickness of, for example, about 150 μm.

The described semiconductor device can be manufactured by bonding the semiconductor chip 3 on the interposer via the elastic material 2, followed by electrically connecting the conductive pattern 102 of the interposer and the external electrode 301 of the semiconductor chip 3. The insulating resin 5 then seals, by transfer mold processing, the periphery of the semiconductor chip 3 and the bonding opening 4. The external connecting terminal 6 is then formed in the external terminal opening.

Examples will be described below of the configuration of the die (hereafter referred to as a mold die) for use in the above-described transfer mold.

EXAMPLE 1

Figure 3:
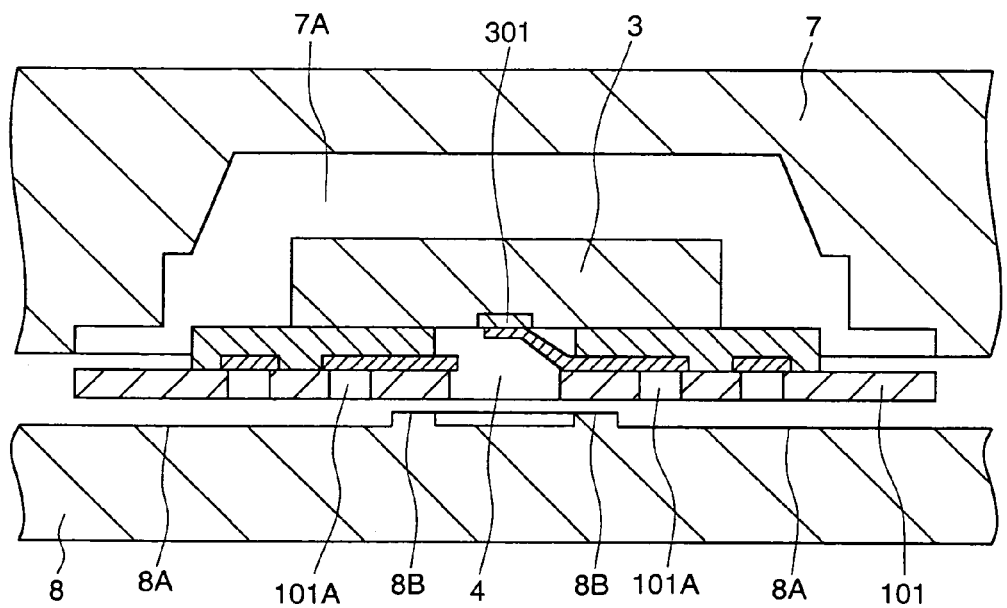
FIG. 3 is a diagram of the configuration of a mold die in an example according to the present invention.
Figure 4:
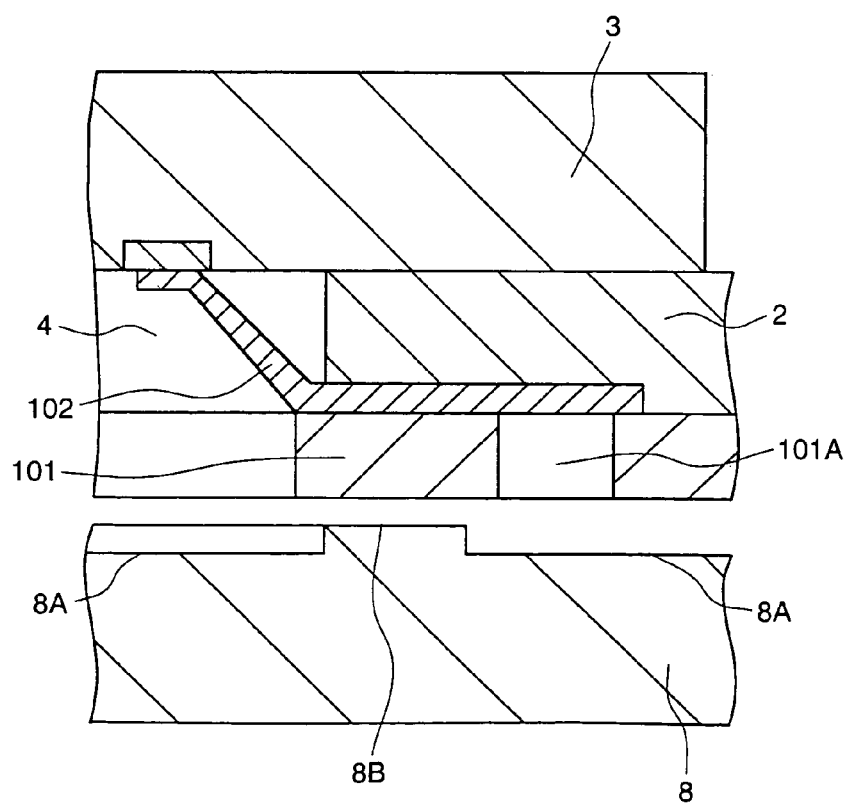
FIG. 4 is an enlarged cross-sectional view of a characteristic part of the mold die shown in FIG. 3.

FIGS. 3 and 4 are diagrams of the configuration of the mold die representing an example according to the present invention. FIG. 3 is a cross-sectional view of the entire configuration of the mold die. FIG. 4 is an enlarged cross-sectional view of a characteristic part of the mold die.

The mold die in this example includes a pair of die members consisting of a top die 7 and a bottom die 8, which sandwich the interposer bearing the semiconductor chip 3, as shown in FIG. 3. The top die 7 includes a recess space 7A into which the insulating resin flows for sealing the periphery of the semiconductor chip 3.

The bottom die 8 includes a protrusion 8B in a predetermined form on the upper surface thereof so as to come into close contact with the insulating substrate 101 (hereafter referred to as a reference contact surface), as shown in FIGS. 3 and 4. The protrusion 8B is provided in the form of a loop around a rectangular opening, such as the bonding opening, to be sealed with insulating resin 5.

The protrusion 8B has such a width that, for example, the above-described protrusion 8B come into contact with the insulating substrate 101 between the opening 4 and the opening 101A for forming the external connecting terminal, as shown in FIG. 4. The protrusion 8B has a height of, for example, about 10 μm.

Figure 5:
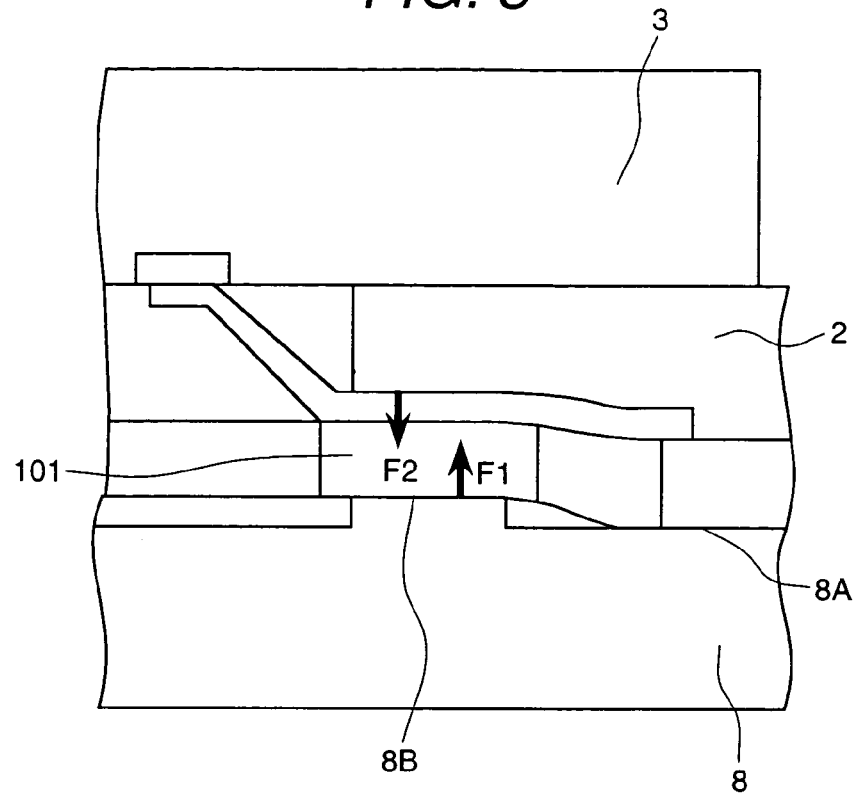
FIG. 5 is a cross-sectional diagram illustrating the operational advantage of the mold die during the molding process.
Figure 6:
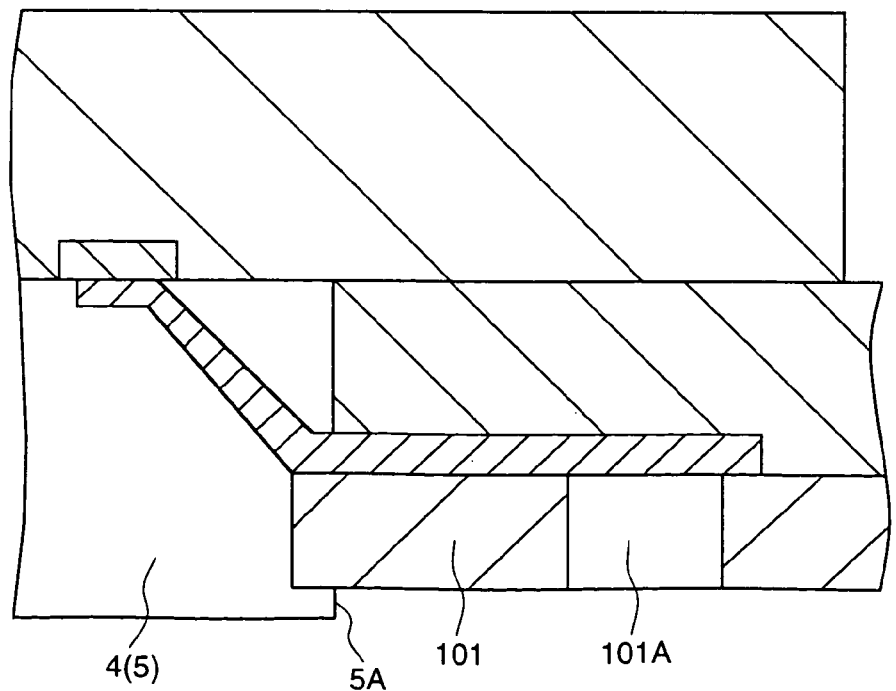
FIG. 6 is a cross-sectional diagram illustrating the operational advantage of the mold die after the molding process.
Figure 7:
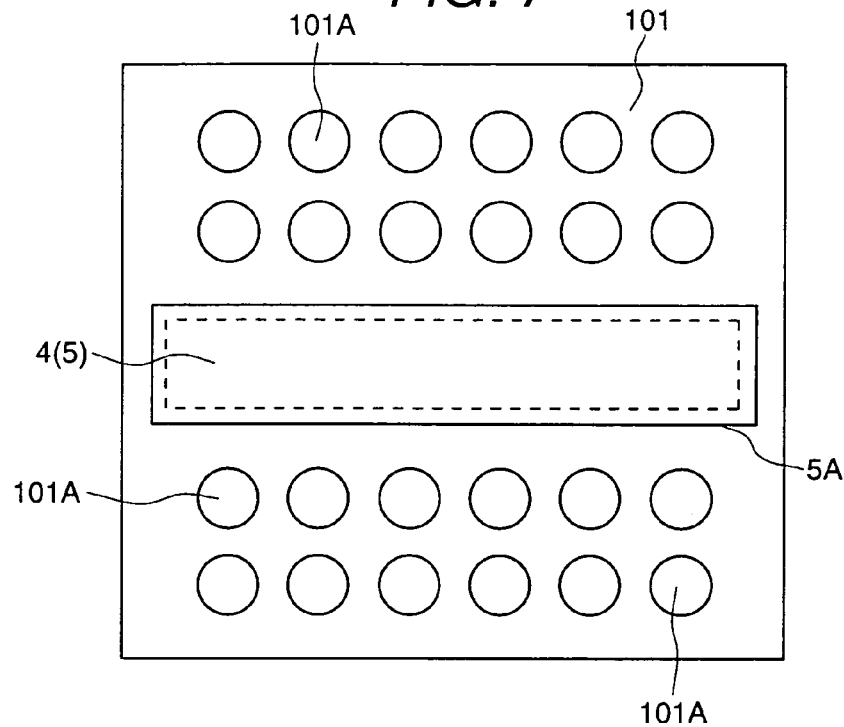
FIG. 7 shows a back view of the semiconductor device illustrating the operational advantage of the mold die after the molding process.

FIGS. 5 to 7 are diagrams which illustrate the operational advantage of the mold die in the example 1. FIG. 5 is a cross-sectional view of the condition during the molding process. FIG. 6 is a cross-sectional view of the semiconductor device after the molding process is complete. FIG. 7 shows a back view of the semiconductor device after completion of the molding process. FIG. 5 shows the same cross section as in FIG. 4, although it omits the hatching (parallel oblique lines) representing the cross section. FIG. 7 is a view from the back of FIG. 1.

The mold die in the example 1 can be used for the transfer mold by, as shown in FIG. 4, disposing the interposer bearing the semiconductor chip 3 between the top die 7 and the bottom die 8; followed by, for example, sandwiching the insulating substrate 101 between the top die 7 and the bottom die 8, and fastening the substrate 101 with a predetermined pressure.

In the contact portion between the insulating substrate 101 and the protrusion 8B of the bottom die 8, the insulating substrate 101 will be distorted with the force F1 from the protrusion 8B of the bottom die 8. The insulating substrate 101 will have a distorted portion that is pressed by the protrusion 8B of the bottom die 8, thereby the elastic material 2 also will be distorted. The elastic material 2 is in a contracted condition and tends to return to its original condition. Thus, the insulating substrate 101 also will receive from the elastic material 2 a force F2, which is opposite to the force F1 from the protrusion 8B of the bottom die 8, as shown in FIG. 5.

Figure 11:
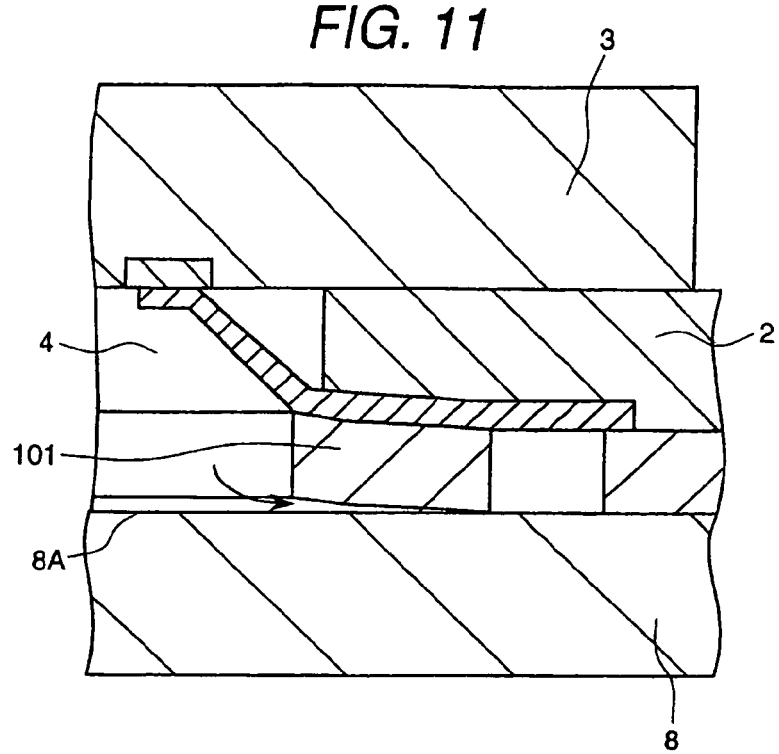
FIG. 11 is a diagram illustrating the problems of the conventional mold die.

As a result, the degree of contact between the insulating substrate 101 and the protrusion 8B of the bottom die 8 will be higher than, for example, the degree of contact between the insulating substrate 101 and the reference contact surface 8A of the bottom die 8. Even when the insulating substrate 101 is distorted in the area around the bonding opening 4, for example, as shown in FIG. 11, the protrusion 8B of the bottom die 8 can prevent any space from appearing at the portion where the wiring or distortion occurs.

As described above, the mold die in the example 1 can prevent the insulating resin 5 which flows into the bonding opening 4 from leaking through between the insulating substrate 101 and the bottom die 8. It is thus possible, for example, as shown in FIGS. 6 and 7, to prevent any spreading of the front end 5A of the insulating resin 5 which flows into the bonding opening 4, and to prevent the flow of the insulating resin 5 into an opening 101A for forming the external connecting terminal.

When the protrusion 8B on the surface of the bottom die 8 is provided outside the edge of the bonding opening 4, as shown in FIG. 4, the insulating resin 5 which flows into the described bonding opening 4 can reach the back of the surface of the insulating substrate 101, specifically, the surface on which the semiconductor chip 3 is bonded, so that the front end 5A of the insulating resin 5 can reach outside the edge of the bonding opening 4, as shown in FIGS. 6 and 7. As a result, the interface delamination will occur less frequently between the insulating substrate 101 and the insulating resin 4 around the bonding opening 4.

Figure 12:
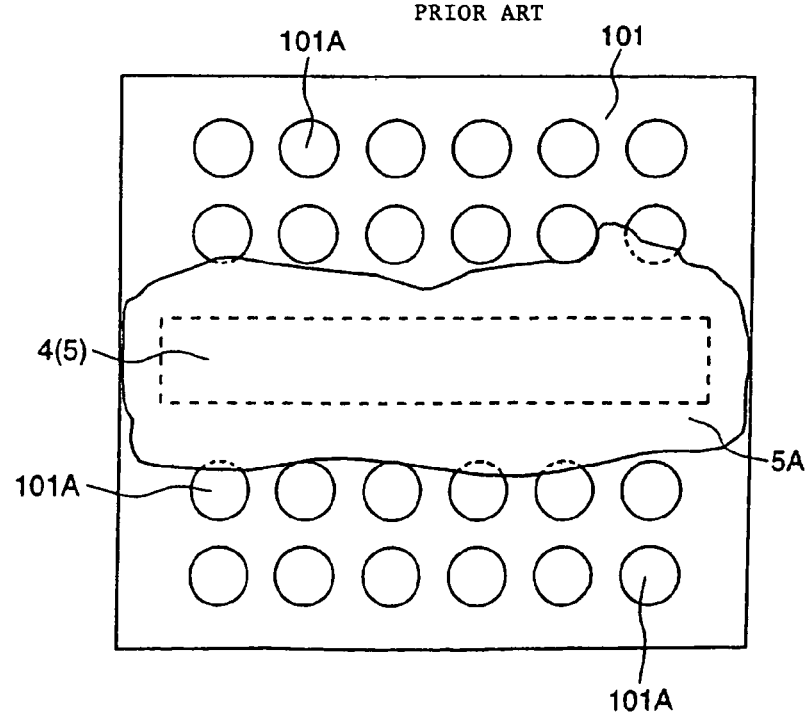
FIG. 12 is a diagram further illustrating the problems of the conventional mold die.

As described above, in the mold die of example 1, a higher degree of contact is produced between the bottom die 8 and the periphery of the bonding opening 4 provided on the interposer, thereby preventing the insulating resin 5 which flows into the bonding opening 4 from leaking in between the insulating substrate 101 and the bottom die 8. It is thus possible to prevent the insulating resin 5 from spreading over the surface of the insulating substrate 101, as shown in FIG. 12, and from flowing into the opening 101A for forming the external connecting terminal, thereby improving the manufacturing yield of the semiconductor device.

Figure 8:
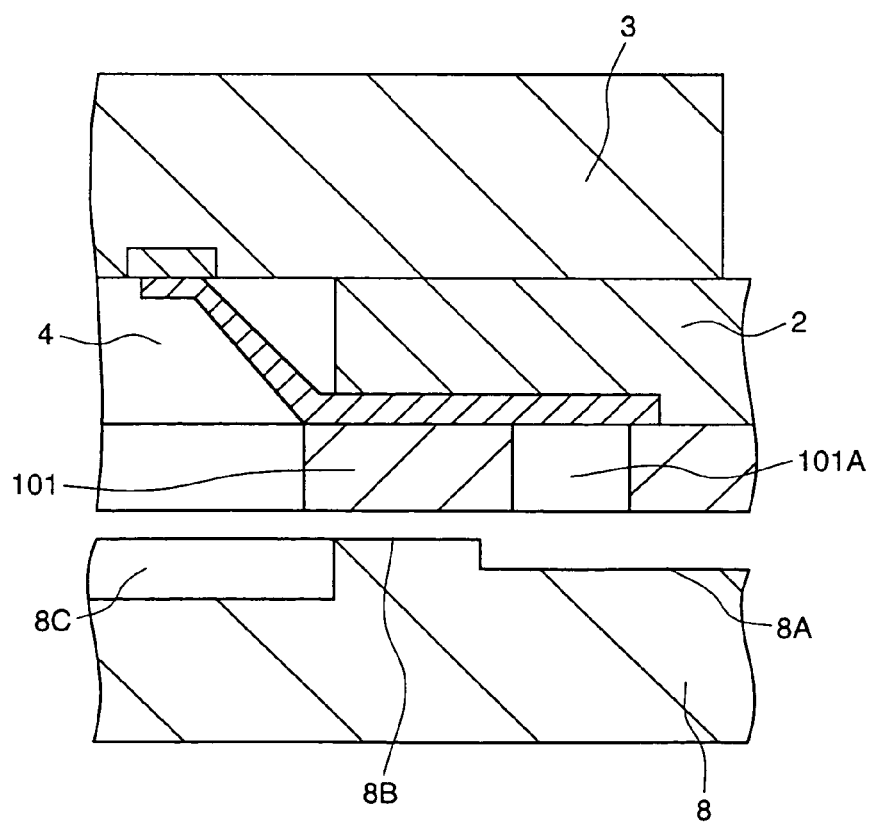
FIG. 8 is a cross-sectional diagram illustrating an application of an example of the mold die.
Figure 9:
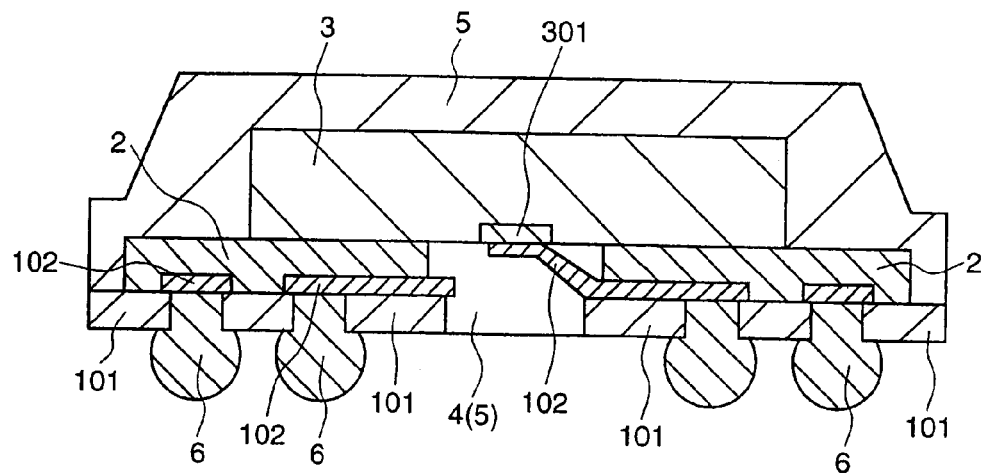
FIG. 9 is a cross-sectional diagram of a conventional BGA type semiconductor device.
Figure 10:
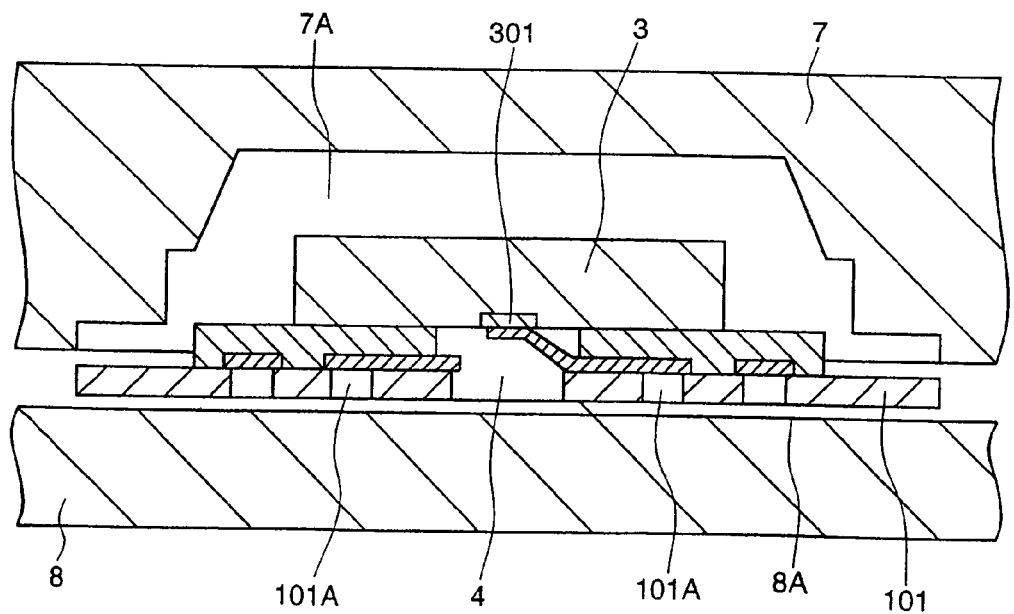
FIG. 10 is a cross-sectional diagram of a conventional mold die.

FIG. 8 is a cross-sectional diagram illustrating an application of the example.

The mold die in the example 1 uses a bottom die 8 on which the area inside the protrusion 8B is approximately the same height as the reference surface 8A, as shown in FIG. 3. Additionally, the area inside the protrusion 8B may include a recess 8C, as shown in FIG. 8. The recess 8C may have a depth of about 70 μm from the reference surface 8A.

The bottom die 8 with the recess 8C can also include, around the recess 8C, the protrusion 8B with a height of about 10 μm from the reference surface 8A to give higher degree of contact between the bottom die 8 and the insulating substrate 101 around the periphery of the bonding opening 4.

It is thus possible to prevent the insulating resin 5 which flows into the bonding opening 4 from leaking in between the interposer (insulating substrate 101) and the bottom die 8.

When the recess 8C is provided, the insulating resin 5 which flows into the bonding opening 4 may run into the recess 8C. The insulating resin 5 in the recess 8C may be cured to provide the complete semiconductor device in which the cured insulating resin 5 may have a front end 5A, as shown in FIG. 6, of greater thickness than in the example.

With the bottom die 8 as shown in the example, the edge of the bonding opening 4 may contact with the reference surface 8A of the bottom die 8, so that the front end 5A of the insulating resin 5 may have various shapes.

On the other hand, with the bottom die 8 shown in FIG. 8, the base of the recess 8C is lower than the reference surface 8A to prevent the edge of the bonding opening 4 from contacting the bottom die 8. The front end 5A of the insulating resin 5 can thus have less varied shapes (thicknesses), and the interface delamination will occur much less frequently between the insulating substrate 101 and the insulating resin 5.

The above-described example 1 provides an illustration of a semiconductor device in which the conductive pattern 102 is deformed to be electrically connected with the external electrode 301 of the semiconductor chip 3. Additionally, the semiconductor device may be one in which, for example, the conductive pattern 102 is connected with the external electrode 301 of the semiconductor chip 3 via a bonding wire. In this case, to ensure the sealing of the bonding wire, the bottom die with the recess 8C, as shown in FIG. 8, may preferably be used rather than the bottom die 8 described in connection with example 1.

While the present invention has been described with reference to an example, it should be understood that the invention is not limited to the above-described example and various modifications are possible without departing from the spirit thereof.

Representative examples of the invention disclosed in this specification can provide such effects as briefly described as follows.

The opening of the interposer can be sealed by transfer mold processing while preventing leakage of the insulating resin from the opening and reducing poor electrical conduction of the external connecting terminal due to leakage of insulating resin. It is thus possible to improve the manufacturing yield of the semiconductor device.

What is claimed is:

1. A mold die comprising a first die having a recess of a predetermined form and a second flat die, said first die to be disposed on a surface of a wiring board which has a plurality of openings including a bonding opening and a semiconductor chip mounted on said surface via an elastic material, and said second die to be disposed on a back of said surface of said wiring board on which said semiconductor chip is mounted, for sealing with an insulating resin a periphery of said semiconductor chip and at least said bonding opening of said wiring board, wherein said second die comprises a loop-shaped protrusion disposed in a loop surrounding an area overlapping said bonding opening to be sealed with said insulating resin and has generally flat plate-shape surfaces in areas within and outside said loop-shaped protrusion recessed from said loop-shaped protrusion, said loop-shaped protrusion being configured to press said wiring board toward said semiconductor chip around said area overlapping said bonding opening.

2. The mold die according to claim 1, wherein said wiring board has a conductive pattern electrically connected to an external electrode of said semiconductor chip in said bonding opening.

3. The mold die according to claim 2, wherein the flat shape-surface area within the loop-shaped protrusion has a height the same as a height of the flat plate-shape surface area outside the loop-shaped protrusion.

4. The mold die according to claim 2, wherein the second die includes a recess provided within the loop-shaped protrusion such that a height of the flat plate-shape surface area within the loop-shaped protrusion has a height further recessed from a top of the loop-shaped protrusion that the flat plate-shape surface area outside the loop-shaped protrusion.

5. The mold die according to claim 1, wherein the flat shape-surface area within the loop-shaped protrusion has a height the same as a height of the flat plate-shape surface area outside the loop-shaped protrusion.

6. The mold die according to claim 1, wherein the second die includes a recess provided within the loop-shaped protrusion such that a height of the flat plate-shape surface area within the loop-shaped protrusion has a height further recessed from a top of the loop-shaped protrusion that the flat plate-shape surface area outside the loop-shaped protrusion.

7. A method for manufacturing a semiconductor device by sealing, by transfer mold processing using a die, a semiconductor chip mounted on a wiring board via an elastic material, wherein said wiring board includes an insulating substrate with a plurality of openings including a bonding opening thereon on which a conductive pattern is formed, and by sealing at least said bonding opening, wherein a die having a loop-shaped protrusion disposed in a loop surrounding an area overlapping said bonding opening to be sealed and has generally flat plate-shape surfaces in areas within and outside said loop-shaped protrusion recessed from said loop-shaped protrusion is used for a back die member to be placed in contact with the surface of said wiring board on the opposite side on which said semiconductor chip is mounted, and during said sealing, said loop-shaped protrusion presses said wiring board toward said semiconductor chip around said area overlapping said bonding opening.

8. The method according to claim 7, wherein said wiring board has a conductive pattern electrically connected to an external electrode of said semiconductor chip in said bonding opening.

9. The method according to claim 8, wherein the flat shape-surface area within the loop-shaped protrusion has a height the same as a height of the flat plate-shape surface area outside the loop-shaped protrusion.

10. The method according to claim 8, wherein the second die includes a recess provided within the loop-shaped protrusion such that a height of the flat plate-shape surface area within the loop-shaped protrusion has a height further recessed from a top of the loop-shaped protrusion that the flat plate-shape surface area outside the loop-shaped protrusion.

11. The mold die according to claim 7, wherein the flat shape-surface area within the loop-shaped protrusion has a height the same as a height of the flat plate-shape surface area outside the loop-shaped protrusion.

12. The method according to claim 2, wherein the second die includes a recess provided within the loop-shaped protrusion such that a height of the flat plate-shape surface area within the loop-shaped protrusion has a height further recessed from a top of the loop-shaped protrusion that the flat plate-shape surface area outside the loop-shaped protrusion.

* * * * *